(12) United States Patent
Li et al.

(10) Patent No.: US 11,955,344 B2
(45) Date of Patent: Apr. 9, 2024

(54) METHODS AND STRUCTURES FOR CHANGING WAFER BOW

(71) Applicant: Yangtze Memory Technologies Co., Ltd., Hubei (CN)

(72) Inventors: JinHao Li, Wuhan (CN); FeiFei Tu, Wuhan (CN); Xiao Hou, Wuhan (CN); Xianchun Deng, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/646,817

(22) Filed: Jan. 3, 2022

(65) Prior Publication Data

US 2023/0134311 A1 May 4, 2023

Related U.S. Application Data

(63) Continuation of application No. PCT/CN2021/127767, filed on Oct. 30, 2021.

(51) Int. Cl.
| | | |
|---|---|---|
| *H01L 21/477* | (2006.01) | |
| *H01L 21/3105* | (2006.01) | |
| *H01L 23/00* | (2006.01) | |
| *H10B 41/27* | (2023.01) | |
| *H10B 43/27* | (2023.01) | |

(52) U.S. Cl.
CPC ........ *H01L 21/477* (2013.01); *H01L 21/3105* (2013.01); *H01L 23/562* (2013.01); *H10B 41/27* (2023.02); *H10B 43/27* (2023.02)

(58) Field of Classification Search
None
See application file for complete search history.

(56) References Cited

U.S. PATENT DOCUMENTS

2017/0053799 A1* 2/2017 Van Schravendijk ...................... H01L 21/0217

FOREIGN PATENT DOCUMENTS

| CN | 112216609 A | 1/2021 |
| CN | 113228279 A | 8/2021 |

OTHER PUBLICATIONS

International Search Report dated Jul. 27, 2022 in PCT/CN2021/127767, 4 pages.

* cited by examiner

*Primary Examiner* — Grant S Withers
(74) *Attorney, Agent, or Firm* — Oblon, McClelland, Maier & Neustadt, L.L.P.

(57) ABSTRACT

According to an aspect of the disclosure, a method of controlling bow of a substrate is provided. In the method, a substrate is provided on which a dielectric layer is formed. The substrate has a bow with respect to a reference plane. The bow of the substrate is adjusted by performing an annealing process on the substrate. The annealing process includes one of a first process condition and a second process condition. The first process condition induces a tensile stress on the substrate to cause the substrate to bow upward with respect to the reference plane. The second process condition induces a compressive stress on the substrate to cause the substrate to bow downward with respect to the reference plane.

9 Claims, 13 Drawing Sheets

| Item | X-Bow | Y-Bow | X-Bow | Y-Bow |
|---|---|---|---|---|
| Pre Bow | 187.67 | 101.86 | 186.96 | 101.44 |
| Process | WET OX | | N2 ANL | |
| Post Bow | 213.16 | 100.26 | 533.26 | 366.69 |
| Delta Bow | 25.49 | -1.6 | 346.30 | 265.25 |

METHODS AND STRUCTURES FOR CHANGING WAFER BOW

RELATED APPLICATION

This application is a bypass continuation of International Application No. PCT/CN2021/127767, filed on Oct. 30, 2021. The entire disclosure of the prior application is hereby incorporated by reference in its entirety.

BACKGROUND

Flash memory devices have recently been through a rapid development. The flash memory devices are able to retain the stored data for a long period of time without applying a voltage. To increase the bit density and reduce the bit cost of the flash memory devices, three-dimensional (3D) NAND (Not AND) flash memory devices have been developed. The 3D-NAND memory device can include a stack of alternating word line layers and insulating layers over a substrate wafer. As the layers of stack increase to achieve a higher storage density, the structure of the layers may be changed due to the subsequent thermal processes. The change of the structure in the layers of the stack may not only change the quality of layers, but also change a bending degree of the substrate wafer.

SUMMARY

The present disclosure describes embodiments generally related to structures and methods for changing a substrate bow.

According to an aspect of the disclosure, a method of controlling bow of a substrate is provided. In the method, a dielectric layer can be formed over the substrate on a reference plane, where the substrate on which the dielectric layer is formed can have a bow with respect to the reference plane. The bow of the substrate can be adjusted by performing an annealing process on the substrate. The annealing process can induce a tensile stress on the substrate to cause the substrate to bow upward with respect to the reference plane according to a first process condition. The annealing process can also induce a compressive stress on the substrate to cause the substrate to bow downward with respect to the reference plane according to a second process condition.

In order to form the dielectric layer over the substrate, one of high density plasma (HDP) silicon oxide and tetraethyl orthosilicate (TEOS) can be deposited over the substrate. Thus, the substrate can bow downward with respect to the reference plane and a value of the bow can be negative after the one of the HDP silicon oxide and the TEOS is deposited on the substrate.

In some embodiments, the first process condition of the annealing process can include a $N_2$ gas with a flow rate between 15 standard liter per minute (slm) and 25 slm, a processing time in a range between 3 hours and 5 hours, a processing temperature in a range between 500° C. and 700° C., and a pressure in a range from 0.1 Torr to 760 Torr. Accordingly, the value of the bow of the substrate can increase by 10 um to 70 um in response to the TEOS being deposited and the first process condition of the annealing process being applied. The value of the bow of the substrate can increase by 110 um and 150 um in response to the HDP silicon oxide being deposited and the first process condition of the annealing process being applied.

In some embodiments, the first process condition of the annealing process can reduce a hydrogen atomic concentration in the dielectric layer.

In the method, the second process condition of the annealing process can include a $N_2$ gas with a flow rate between 15 slm and 25 slm, a processing time in a range between 3 hours and 5 hours, a processing temperature larger than 700° C., and a pressure in a range from 0.1 Torr to 760 Torr. Accordingly, the value of the bow of the substrate can increase by 50 um to 100 um in response to the HDP silicon oxide being deposited and the second process condition of the annealing process being applied, and the value of the bow of the substrate can decrease by 80 um to 120 um in response to the TEOS being deposited and the second process condition of the annealing process being applied.

In some embodiments, the second process condition of the annealing process can include $H_2O$ steam generated by a mixture of a $H_2$ gas and an $O_2$ gas with a ratio of 1:1 to 3:1, the $H_2$ gas having a flow rate between 5 slm and 10 slm, the $O_2$ gas having a flow rate between 5 slm and 10 slm, a processing time in a range between 1 hour and 3 hours, and a processing temperature between 600° C. and 700° C. Accordingly, the value of the bow of the substrate can decrease by 30 um to 70 um in response to the TEOS being deposited and the second process condition of the annealing process being applied. The value of the bow of the substrate can increase by 55 um to 95 um in response to the HDP silicon oxide being deposited and the second process condition of the annealing process being applied.

According to another aspect of the disclosure, a method of controlling bow of a substrate is provided. In the method, a first dielectric layer can be formed over the substrate on a reference plane so that the substrate on which the first dielectric layer is formed can have a bow with respect to the reference plane. An annealing process can be performed on the substrate to adjust the bow of the substrate. A second dielectric layer can be formed over the first dielectric layer. The first and second dielectric layers can be patterned to form openings in the first and second dielectric layers. The annealing process can induce a tensile stress on the substrate to cause the substrate to bow upward with respect to the reference plane according to a first process condition. The annealing process can also induce a compressive stress on the substrate to cause the substrate to bow downward with respect to the reference plane according to a second process condition.

In some embodiments, the first dielectric layer can include HDP silicon oxide and the second dielectric layer can include TEOS.

In some embodiments, the first process condition of the annealing process can include a $N_2$ gas with a flow rate between 15 slm and 25 slm, a processing time in a range between 3 hours and 5 hours, a processing temperature in a range between 500° C. and 700° C., and a pressure in a range from 0.1 Torr to 760 Torr. Accordingly, a value of the bow of the substrate can increase by 10 um to 70 um in response to the TEOS being deposited on the substrate and the first process condition of the annealing process being applied. The value of the bow of the substrate can increase by 110 um and 150 um in response to the HDP silicon oxide being deposited on the substrate and the first process condition of the annealing process being applied.

In some embodiments, the first process condition of the annealing process can reduce a hydrogen atomic concentration in the first and second dielectric layers.

In the method, the second process condition of the annealing process can include a $N_2$ gas with a flow rate between 15 slm and 25 slm, a processing time in a range between 3 hours and 5 hours, a processing temperature larger than 700° C., and a pressure in a range from 0.1 Torr to 760 Torr. Accordingly, a value of the bow of the substrate can increase by 50 um to 100 um in response to the HDP silicon oxide being deposited on the substrate and the second process condition of the annealing process being applied. The value of the bow of the substrate can decrease by 80 um to 120 um in response to the TEOS being deposited on the substrate and the second process condition of the annealing process being applied.

Accordingly yet another aspect of the disclosure, a method of controlling bow of a substrate is provided. In the method, a stack of alternating oxide layers and sacrificial layers can be formed over the substrate on a reference plane, where the substrate on which the stack is formed can have a bow with respect to the reference plane. A plurality of contact openings can be formed in the stack by an etching process, where the plurality of contact openings can extend through the oxide layers and the sacrificial layers. An annealing process can be performed on the substrate to remove etching residuals of the etching process. A wet clean process can be performed on the substrate to remove the etching residuals of the etching process. The annealing process can induce a tensile stress on the substrate to cause the substrate to bow upward with respect to the reference plane according to a first process condition, and induce a compressive stress on the substrate to cause the substrate to bow downward with respect to the reference plane according to a second process condition.

In some embodiments, the second process condition of the annealing process can include $H_2O$ steam generated by a mixture of a $H_2$ gas and an $O_2$ gas with a ratio of 1:1 to 3:1, the $H_2$ gas having a flow rate between 5 slm and 10 slm, the $O_2$ gas having a flow rate between 5 slm and 10 slm, a processing time in a range between 1 hour and 3 hours, and a processing temperature between 600° C. and 700° C. Accordingly, a value of the bow of the substrate can be in a range between 150 um to 200 um in a first direction, and in a range between 80 um to 120 um in a second direction before the annealing process is applied on the substrate. The value of the bow of the substrate can increase by 10 um to 50 um in the first direction, and reduce by 1 um to 10 um in the second direction after the annealing process is applied on the substrate.

In some embodiments, the first process condition of the annealing process can include a $N_2$ gas with a flow rate between 15 slm and 25 slm, a processing time in a range between 3 hours and 5 hours, and a processing temperature in a range between 500° C. and 700° C., an a pressure in a range from 0.1 Torr to 760 Torr.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
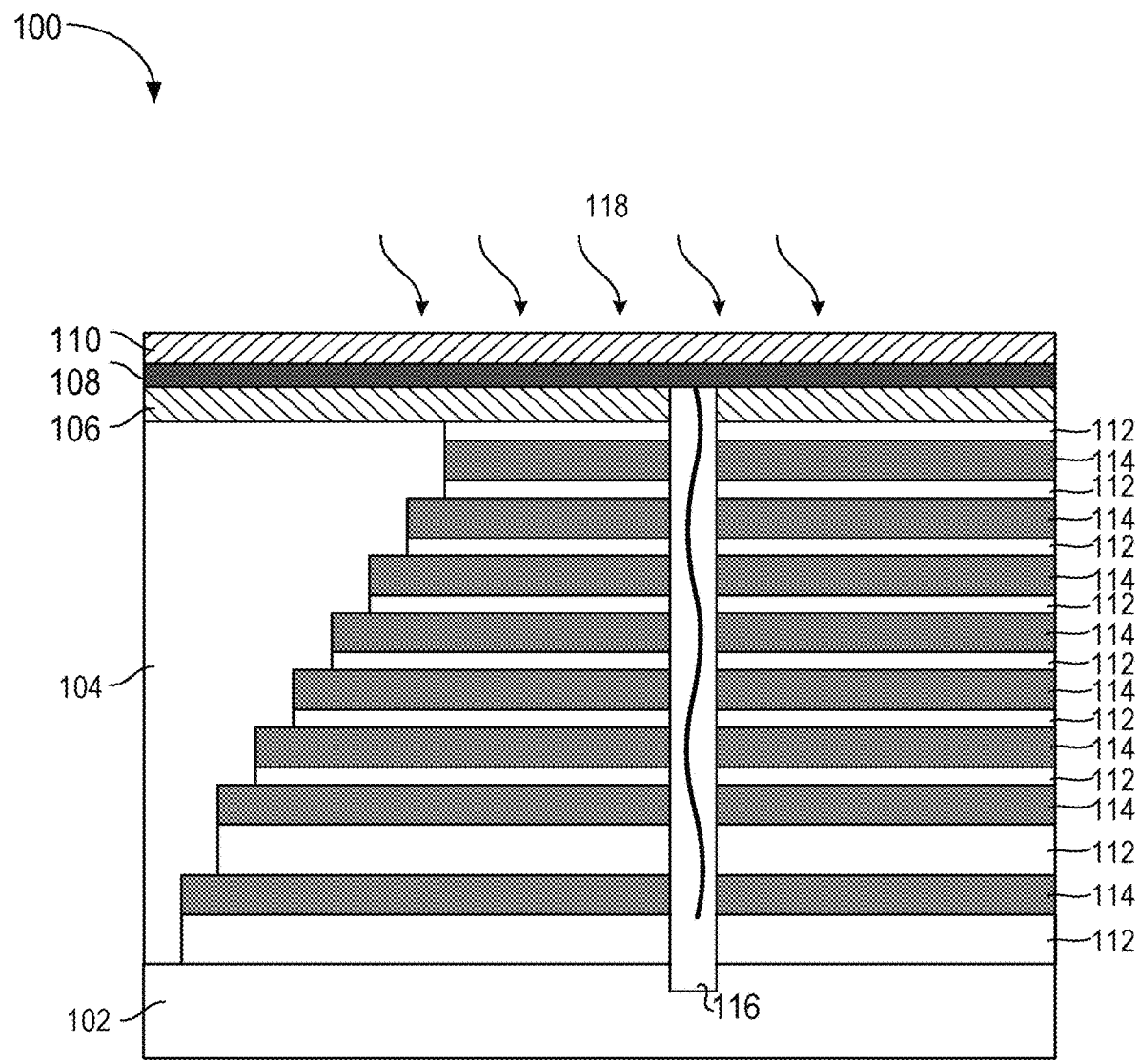
FIG. 1 is a cross-sectional view of a 3D-NAND memory structure, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to form a 3D-NAND memory device, a stack of alternating oxide layers and sacrificial layers (e.g., SiN layers) can be formed over a substrate. A staircase including a plurality of steps can be formed in the stack. The sacrificial layers can be subsequently removed, such as by a wet etch, and replaced with a conductive material to form word line layers that are arranged between the oxide layers. As the 3D-NAND memory device migrates to a higher storage density, the number of the layers (e.g., oxide layer and SiN layers) in the stack is increased. Thermal processes in subsequent manufacturing steps can cause changes both in structures of the stack and in properties of the layers of the stack, which can result in a warpage (or bow) of the substrate. The bow of the substrate can impact manufacturing processes, such as a film deposition process, wafer-bonding process, or a photolithography process.

In related examples, a $N_2$ gas annealing is introduced in order to adjust the bow of the substrate. The $N_2$ gas annealing can normally be performed at a temperature between 650° C. and 850° C. However, measurement results show that the $N_2$ gas annealing at 650° C. and 850° C. can induce a tensile stress, which can cause the substrate to bow upward with respect to a reference plane on which the substrate is positioned. The reference plane can be a substrate holder in a metrology tool or a process tool, such as a film deposition tool or a photo scanner. It is understood that the reference plane could be virtual plane in an embodiment.

In the disclosure, various annealing processes (or heat treatment processes) different from the heat treatment process in the related examples can be applied according to the manufacturing positions of the 3D-NAND memory device. Thus, the substrate on which the 3D-NAND memory device is formed can maintain a same bending degree, a more negative bending degree (or bow downward further), or a more positive bending degree (or bow upward further) to meet the requirements of the manufacturing processes.

FIG. 1 is a cross-sectional view of an intermediate structure 100 (or structure 100) of a 3D-NAND memory device that is in the manufacturing flow. As shown in FIG. 1, the structure 100 can include a stack of alternating oxide layers 112 and sacrificial layers (e.g., nitride layers) 114 on a substrate 102. The sacrificial layers 114 can be replaced by metal layers in subsequent steps to form word line layers for the 3D-NAND memory device. The substrate 102 may be a semiconductor substrate such as Si substrate. The substrate 102 may also include other semiconductors such as germanium (Ge), silicon carbide (SiC), silicon germanium (SiGe), or diamond. Alternatively, the substrate 102 may include a compound semiconductor and/or an alloy semiconductor. By way of example, in some embodiments, the substrate 102 may also include silicon phosphide (SiP), silicon phosphorus carbide (SiPC), a silicon-on-insulator (SOI) structure, a SiGe-on-SOI structure, a Ge-on-SOI structure, III-VI materials, or a combination of any of the above materials. Further, the substrate 102 may optionally include an epitaxial layer (epi-layer), may be strained for performance enhancement, and/or have other suitable enhancement feature.

Still referring to FIG. 1, a plurality of steps can be formed in the stack, where each of the steps can include a pair of an oxide layer and a nitride layer (e.g., SiN layers). The stack can be positioned in a dielectric layer 104. The dielectric layer 104 can be made of any suitable dielectric material, such as high density plasma (HDP) silicon oxide (or HDP oxide), tetraethyl orthosilicate (TEOS), silane oxide, borophospho-silicate glass (BPSG), phospho-silicate glass (PSG), undoped silicate (USG), silicon nitride, silicon oxynitride ($SiO_xN_y$), the like, or a combination thereof. An oxide layer 106 can be formed over the stack, and a hard mask stack can be formed over the oxide layer 106. The hard mask stack can include a SiN layer 108 over the oxide layer 106 and an oxide layer 110 over the SiN layer 108. Further, a plurality of channel structures 116 can be formed in the stack. The channel structure 116 can extend through the oxide layers 112 and the nitride layers 114, and further extend into the substrate 102.

The structure 100 can then be sent on to subsequent manufacturing steps, such as an etching process, a photolithography process, a deposition process, an annealing process, or the like. One or more of the subsequent manufacturing steps can be a high temperature process that can introduce a heat treatment 118 to the structure 100, which can cause structure changes in the stack and property changes in the layers of the stack. The structure changes and property changes can cause a warpage (or bow) of the substrate 102. The bow of the substrate 102 can impact the manufacturing process, such as a film deposition process, or a photolithography process.

Figure 2:
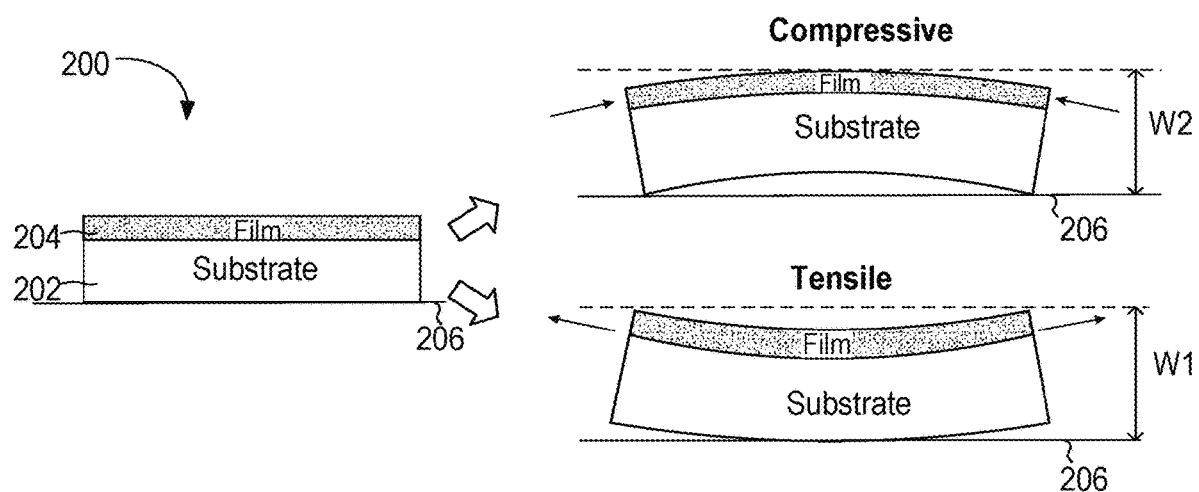
FIG. 2 is a schematic view of impacts of stresses on a substrate to cause the substrate to bow upward or downward, in accordance with exemplary embodiments of the disclosure.

FIG. 2 is schematic view of impacts of stresses on a substrate, in accordance with exemplary embodiments of the disclosure. As shown in FIG. 2, a semiconductor structure 200 can be positioned over a reference plane 206. The reference plane 206 can be a substrate holder of a metrology tool or a process tool (e.g., a deposition tool, an etching tool, a metrology tool, or a photo scanner). The semiconductor structure 200 can include a substrate 202 over the reference plane 206, and a film 204 formed over the substrate 202. When the semiconductor structure 200 is applied with a tensile stress, the semiconductor structure 200 tends to bow upward with respect to the reference plane 206, and the bow can have a value W1 that is positive. When the semiconductor structure 200 is applied with a compressive stress, the semiconductor structure 200 tends to bow downward with respect to the reference plane 206, and the bow can have a value W2 that is negative.

Figure 3:
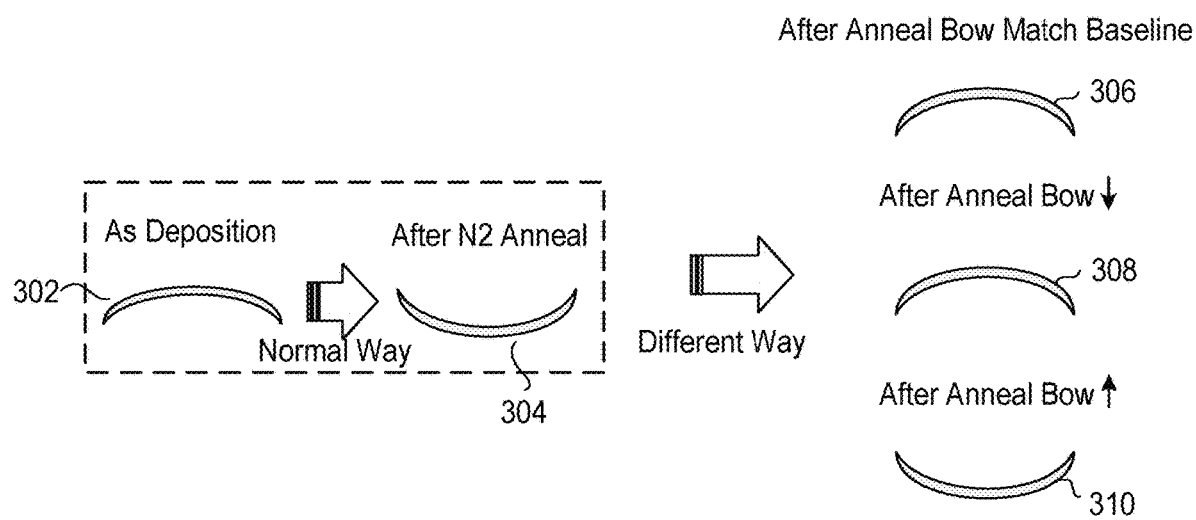
FIG. 3 is a schematic view of controlling bow of a substrate, in accordance with exemplary embodiments of the disclosure.

FIG. 3 is a schematic view of controlling bow of a substrate, in accordance with exemplary embodiments of the disclosure. As shown in FIG. 3, the substrate can have a bow 302 that bends downward and have a negative value when one or more films are formed over the substrate. In a normal way, a $N_2$ gas annealing can be applied on the substrate. The $N_2$ gas annealing can induce a tensile stress on the substrate. The substrate accordingly can have a bow 304 that bends upward and have a positive value. In the disclosure, various annealing processes can be applied on the substrate so that the substrate can have a bow 306 maintaining a same bending degree (or same bow value) to that of the bow 302, a bow 308 with a more negative bending degree (or bow downward further), or a bow 310 with a more positive bending degree (or bow upward further) to meet the process requirements.

Figure 4:
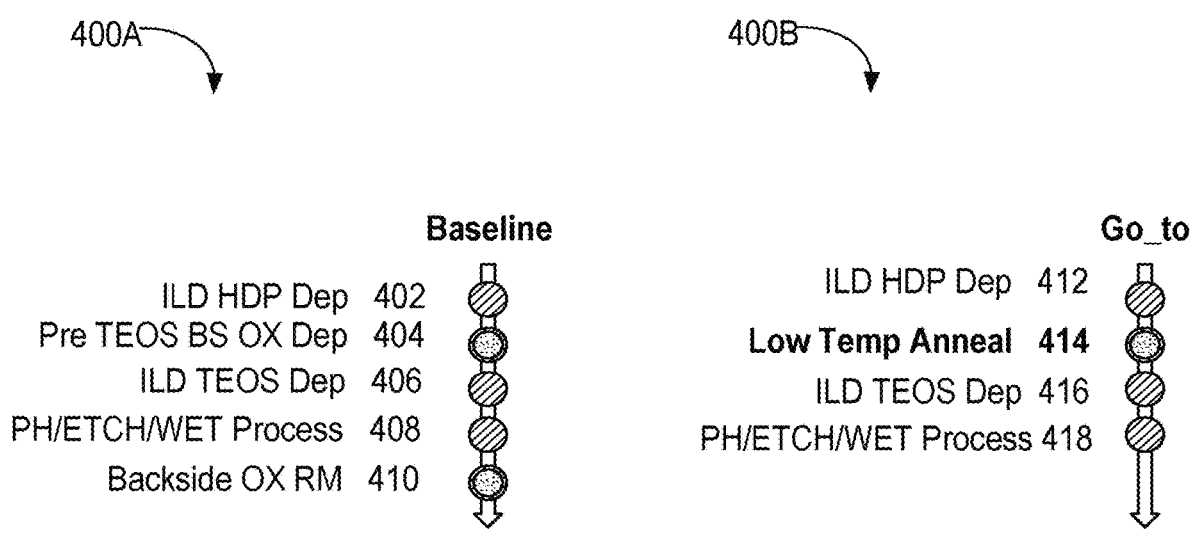
FIG. 4 shows process flows for controlling bow of a substrate, in accordance with exemplary embodiments of the disclosure.

FIG. 4 shows process flows 400A and 400B (or flows 400A and 400B) for controlling bow of a substrate, in accordance with exemplary embodiments of the disclosure. The flow 400A can be a baseline process flow in related examples, where backside film deposition can be applied to adjust a bending degree of a substrate. As shown in the flow 400A, an interlayer dielectric (ILD) HDP deposition 402 can be performed to deposit HDP oxide over a front side of the substrate. In some embodiments, the HDP oxide can induce a compressive stress on the substrate so that the substrate can bow upward, which can impact subsequent processes, such as TEOS deposition. Thus, a pre TEOS backside oxide deposition 404 can be performed to deposit TEOS over a backside of the substrate to compensate for the compressive stress that is induced by the HDP oxide. The flow 400A then proceeds to ILD TEOS deposition 406 which can form a TEOS over the HDP oxide at the front side of the substrate. A patterning process (e.g., photo/etch/wet process) 408 can be applied subsequently to form desired patterns in the HDP oxide and TEOS oxide. A backside oxide removal process 410 can be performed to remove the TEOS that is formed on the backside of the substrate.

The flow 400B shows an embodiment of the disclosure that adjusts the bow of the substrate by using a low temperature annealing process. As shown in the flow 400B, an interlayer dielectric (ILD) HDP deposition 412 can be performed to deposit HDP oxide over the front side of the substrate. A low temperature annealing process 414 can be performed to compensate the compressive stress that is induced by the HDP oxide. The flow 400B then proceeds to ILD TEOS deposition 416 which can form a TEOS over the HDP oxide at the front side of the substrate. A patterning process (e.g., photo/etch/wet process) 418 can be applied subsequently on the HDP oxide and TEOS oxide. Compared to the flow 400A, the flow 400B can have a higher throughput, less manufacturing steps, and a lower cost.

In the disclosure, the low temperature annealing process 414 can be a low temperature $N_2$ annealing process. Of course, other gases, such as $H_2$, Ar, He, $O_2$, the like, or a combination thereof, can also be applied in the low temperature annealing process 414. The low temperature annealing process 414 can include a $N_2$ gas with a flow rate between 15 standard liter per minute (slm) and 25 slm, a processing time in a range between 3 hours and 5 hours, a processing temperature in a range between 500° C. and 700° C., and a pressure in a range from 0.1 Torr to 760 Torr. In an exemplary embodiment of the low temperature annealing process 414, the $N_2$ gas can have a flow rate of 20 slm, a processing time of 4 hours, a process temperature of 550° C., and a pressure of 760 Torr (e.g., atmospheric pressure). In another exemplary embodiment of the low temperature annealing process 414, the processing temperature can be in a range from 550° C. to 650° C.

The HDP oxide can normally be thick, such as in a range of 5 um to 10 um, in the flows 400A and 400B. After the deposition of the HDP oxide on the substrate, the HDP oxide can induce a compressive stress on the substrate. Accordingly, the substrate can bow downward with respect to the reference plane (e.g., a substrate hold of the HDP deposition tool) and the bow can have a negative bending degree (or negative bow value). Thus, in related examples as shown in the flow 400A, an additional backside deposition process (e.g., 404) can be introduced to form a backside oxide (e.g., TEOS). The backside oxide can compensate for the compressive stress that is induced by the HDP oxide, and the bending degree of the substrate can be reduced. In the disclosure, the low temperature annealing process (e.g., 414 in the flow 400B) can induce a tensile stress on the substrate, which in turn can cause the substrate to bow upward. Thus, a downward bow induced by the HDP oxide can be compensated, and a more flat profile of the substrate can be achieved.

The low temperature annealing process can help the free hydrogen atoms escape from the dielectric layers (e.g., the HDP oxide), which can result in voids in the dielectric layers. The voids can further be repaired (or remedied) by the low temperature annealing process and the number of the voids can be reduced as the low temperature annealing process goes on. The reduction of the voids can in turn induce a tensile stress in the dielectric layers. It should be noted that, if the annealing process is performed at a high temperature, such as a temperature larger than 700° C., the atoms in the dielectric layers can be arranged more orderly by the annealing process, which can induce a compressive stress in the dielectric layer.

It should be noted that the flows 400A and 400B can be intermediate steps to form a 3D NAND memory devices. Prior to the flows 400A and 400B, a stack of alternating insulating layers and word line layers (not shown) can be formed over the substrate. The stack can include an array region in which a plurality of channel structures can be formed, and a staircase region including a plurality of steps. Thus, the HDP oxide and the TEOS can be formed over the stack.

Figure 5:
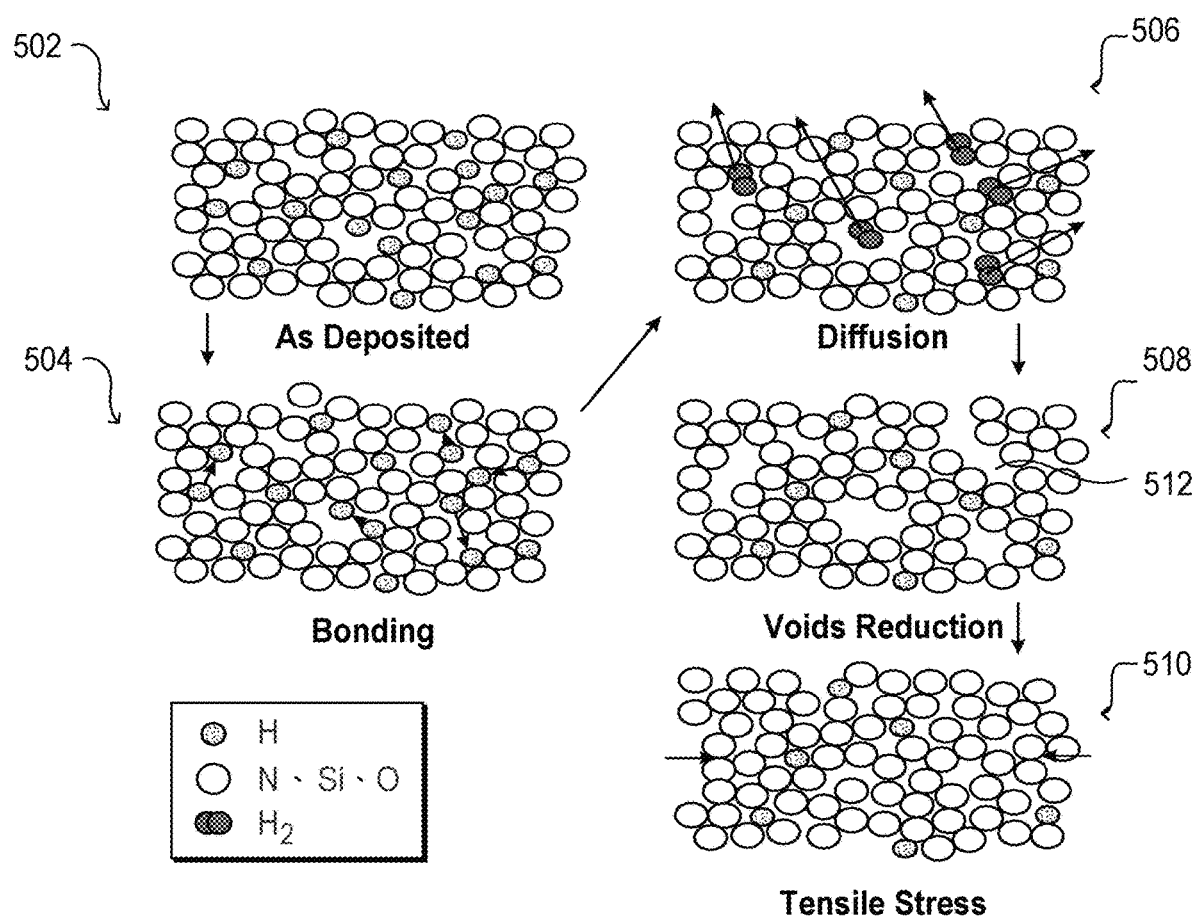
FIG. 5 are schematic views of an impact of an annealing process on a hydrogen atomic concentration of a dielectric layer, in accordance with exemplary embodiments of the disclosure.

FIG. 5 is a schematic view of an impact of the low temperature annealing process (e.g., 414) on a hydrogen atomic concentration of a dielectric layer. As shown in FIG. 5, a dielectric layer (e.g., HDP oxide of TEOS) at an as-deposited state can have a structure 502 that includes hydrogen atoms positioned in other atoms (e.g., N, Si, and O). Further, the lower temperature annealing process can be applied on the dielectric layer. Accordingly the dielectric layer can have a structure 504, where the free hydrogen atoms start to bond each other to form free $H_2$ molecules. As the low temperature annealing process continues, the dielectric layer can have a structure 506 where the free $H_2$ molecules can escape from the dielectric layer, and voids (e.g., 512) can be formed in a structure 508. Further, the dielectric layer can have a structure 510 where the voids can be repaired (or remedied) by the low temperature annealing process and the number of the voids can accordingly be reduced. In the structure 510, the atoms of the dielectric layers can be arranged orderly. The orderly arranged atoms in the dielectric layer can induce a tensile stress on the substrate on which the dielectric layer is positioned.

Figure 6:
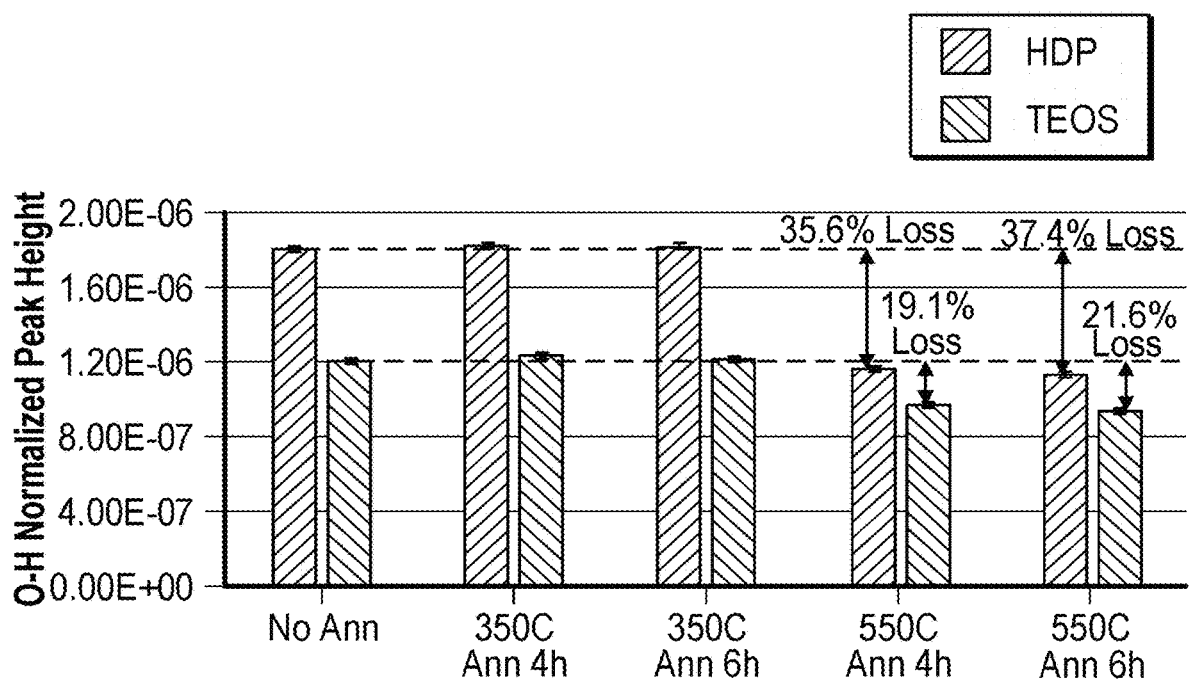
FIG. 6 is a measurement chart showing a hydrogen atomic concentration of a dielectric layer in different annealing process conditions, in accordance with exemplary embodiments of the disclosure.

FIG. 6 is a measurement chart showing a hydrogen atomic concentration of a dielectric layer in different annealing process conditions, in accordance with exemplary embodiments of the disclosure. In an example of FIG. 6, the measurement chart can be obtained by Fourier-transform infrared spectroscopy (FTIR) to measure O—H bond information in the dielectric layer, which can indicate the hydrogen atomic concentration of the dielectric layer. A larger O—H bond peak height can indicate a higher hydrogen atomic concentration.

As shown in FIG. 6, five annealing conditions can be tested: (a) no annealing (No Ann); (b) 350° C. annealing for 4 hours (350° C. Ann 4 h); (c) 350° C. annealing for 6 hours (350 C Ann 6 h); (d) 550° C. annealing for 4 hours (550 C Ann 4 h); and (e) 550° C. annealing for 6 hours (550 C Ann 6 h). The conditions (d) and (e) can be applied in the low temperature annealing process 414 that is illustrated in FIG. 4. In addition, the HDP oxide and the TEOS are tested under the five annealing conditions respectively, where the HDP oxide and the TEOS can be deposited on a respective substrate. As mentioned above, in the related examples, a $N_2$ annealing is normally performed at a high temperature between 650° C. and 850° C. In the disclosure, the $N_2$ annealing is performed at a lower temperature between 550° C. and 650° C., such as 550° C. Compared to the O—H bond peak height in the condition (a), the O—H bond peak heights in the conditions (b) and (c) still maintain a similar height to that in condition (a). However, the O—H bond peak heights drops in conditions (d) and (e) both for the HDP oxide and the TEOS. Thus, the $N_2$ annealing performed at a lower temperature, such as at 550° C. can reduce the hydrogen atomic concentration in the HDP oxide or the TEOS. In addition, comparing the condition (d) and the condition (e), the O—H bond peak height reduces more in condition (e) than that in condition (d), which can indicate that a longer annealing time reduces the hydrogen atomic concentration even more. Thus, based on the measurement chart in FIG. 6, the low temperature annealing process (e.g., 414) reducing the hydrogen atomic concentration can be demonstrated.

Figure 7:
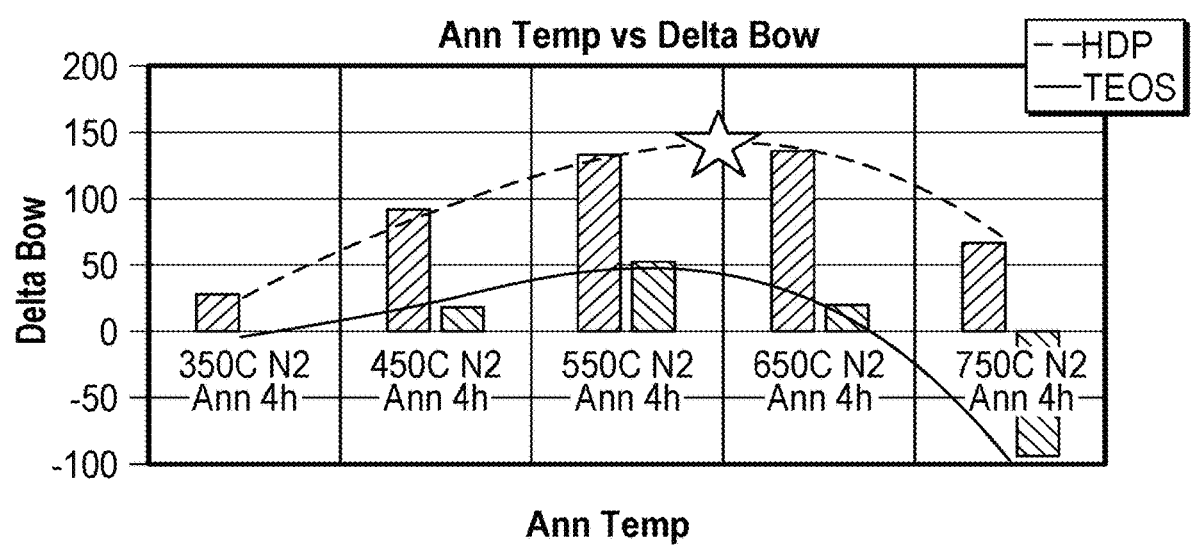
FIG. 7 is a first bow measurement chart showing impacts of different annealing process conditions on a substrate for controlling bow of the substrate, in accordance with exemplary embodiments of the disclosure.

FIG. 7 shows relationships between anneal temperatures and delta bow values of substrates. The delta bow values are equal to post bow values of the substrates measured after the annealing minus pre bow values of substrates measured prior to the annealing. Thus, the delta bow values can indicate the increases or decreases of the bow values of the substrates after the annealing. An increased bow value (or a positive delta bow value) indicates that the substrate is applied with a tensile stress that causes the substrate to bow more upward with respect to the reference plane. Accordingly, when the pre bow value is positive (e.g., 10 um), the post bow value tends to be a more positive value (e.g., 30 um). When the pre bow value is negative (e.g., −15 um), the post bow value tends to be a less negative value (e.g., −5 um) or even a positive value (e.g., 5 um) if the bow direction changes for example from downward to upward. A decreased bow value (or a negative delta bow value) indicates the substrate is applied with a compressive stress that causes the substrate to bow more downward with respect to the reference plane. Accordingly, when the pre bow value is positive (e.g., 10 um), the post bow value tends to be a less positive value (e.g., 5 um) or even a negative value (e.g., −5 um) such as if the bow direction changes for example from upward to downward. When the pre bow value is negative (e.g., −15 um), the post bow value tends to be a more negative value (e.g., −30 um).

As shown in FIG. 7, five annealing conditions are tested: (a) 350° C. $N_2$ annealing for 4 hours (350 C $N_2$ Ann 4 h); (b) 450° C. $N_2$ annealing for 4 hours (450 C $N_2$ Ann 4 h); (c) 550° C. $N_2$ annealing for 4 hours (550 C $N_2$ Ann 4 h); (d) 650° C. $N_2$ annealing for 4 hours (650 C $N_2$ Ann 4 h); and (e) 750° C. $N_2$ annealing for 4 hours (750 C $N_2$ Ann 4 h). The conditions (c) and (d) can be applied in the low temperature annealing process 414 that is illustrated in FIG. 4. In addition, the HDP oxide and the TEOS are tested under the five annealing conditions, where the HDP oxide and the TEOS can be deposited on a respective substrate. As shown in FIG. 7, as the annealing temperature increases from 350° C. to 650° C., the bow values of substrates also increase, which can be indicated by the increased delta bow values. The increased bow values of the substrates in the conditions (c) and (d) can indicate that more tensile stresses can be induced on the substrates annealed in the conditions (c) and (d). Accordingly, the substrates annealed in the conditions (c) and (d) can bend upward further compared to the substrates annealed in the conditions (a) and (b).

Still referring to FIG. 7, the delta bow values of the substrates reach a peak value when the annealing temperature reaches around 610° C., and then start to drop as the annealing temperature proceed to higher values. Especially, when the annealing temperature reaches 750° C., the bow value of the substrate on which the TEOS is formed can be reduced by about 100 um. The reduced bow values of the substrates can indicate that more compressive stresses are applied on the substrates and the substrates accordingly bend downward with respect to the reference plane.

The relationships between anneal temperatures and delta bow values shown in FIG. 7 can be explained by the discussions in FIG. 5. As mentioned above in FIG. 5, the $N_2$ annealing process at a low temperature (e.g., from 550° C. to 650° C.) can help the free hydrogen atoms escape from the dielectric layers (e.g., the HDP oxide and the TEOS), which can result in voids in the dielectric layers. The voids can further be repaired (or remedied) by the low temperature $N_2$ annealing process (or low temperature annealing process) and the number of the voids can be reduced as the low temperature $N_2$ annealing continues. The reduction of the voids can in turn induce a tensile stress in the dielectric film, which can be further exerted on the substrate. Accordingly, the substrate can bow upward and the bow value of the substrate can increase.

However, if the $N_2$ annealing process is performed at a high temperature, such as a temperature larger than 700° C., the atoms in the dielectric layer can be arranged more orderly by the $N_2$ annealing process, which can induce a compressive stress in the dielectric layer, which can be further exerted on the substrate. Accordingly, the substrate can bow downward and the bow value of the substrate can be reduced.

Figure 8:
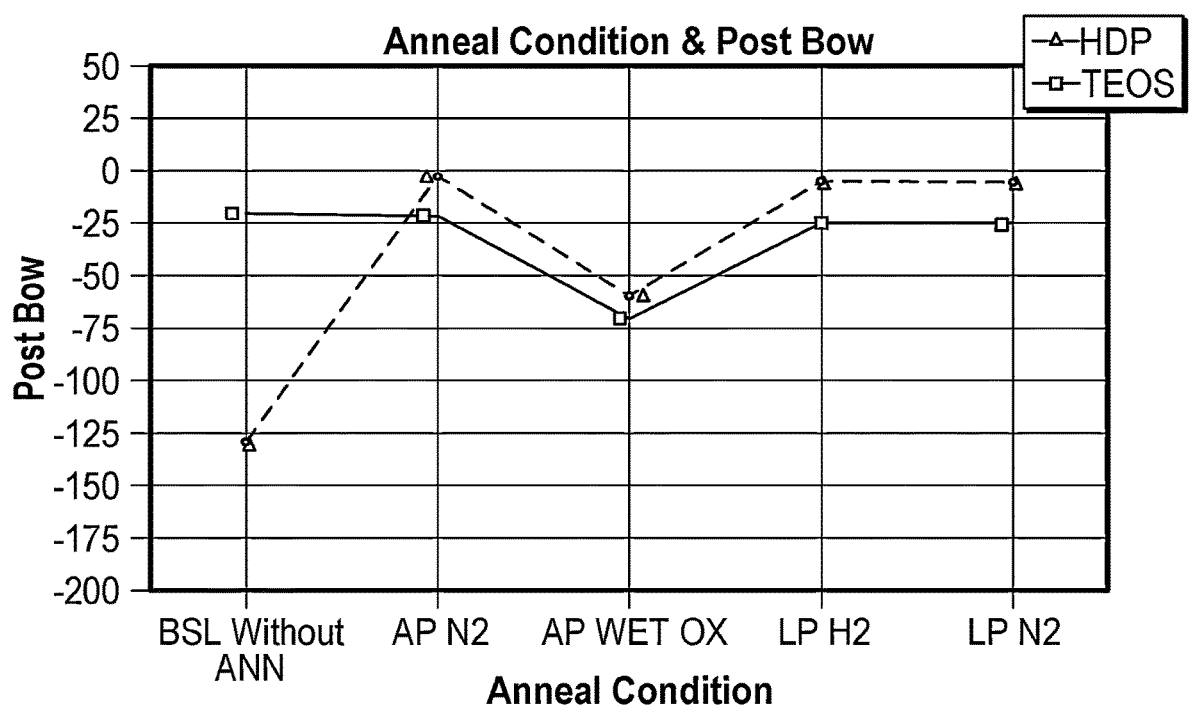
FIG. 8 is a second bow measurement chart showing impacts of different annealing process conditions on a substrate for controlling bow of the substrate, in accordance with exemplary embodiments of the disclosure.

FIG. 8 shows a wet oxidation process that can induce compressive stress on the substrate so that the substrate can bow downward with respect to a reference plane, and the bow value of the substrate accordingly tends to be negative. As shown in FIG. 8, five annealing process conditions can be tested: (a) baseline without anneal (BSL Without ANN); (b) atmospheric $N_2$ anneal (AP $N_2$); (c) the wet oxidation process (AP WET OX); (d) low pressure $H_2$ anneal (LP $H_2$); and (e) low pressure $N_2$ anneal (LP $N_2$). In an exemplary embodiment of FIG. 8, the condition (b) can be performed at 650° C., for 2 hours, with a $N_2$ flow rate of 20 slm. The condition (d) can be performed at 650° C., for 2 hours, with a $H_2$ flow rate of 20 slm, and under a pressure of 0.35 Torr. The condition (e) can be performed at 650° C., for 2 hours, with a $N_2$ flow rate of 20 slm, and under a pressure of 0.35 Torr. In addition, the HDP oxide and the TEOS can be tested under the five annealing conditions, where the HDP oxide and the TEOS can be deposited on a respective substrate.

The condition (c) of the wet oxidation process can be performed at 650° C., for 2 hours, at an atmospheric pressure (e.g., 760 Torr), and by introducing a mixture of a $H_2$ gas and an $O_2$ gas with a ratio of 1:1 to 3:1. The $H_2$ gas can have a flow rate between 5 slm and 10 slm, the $O_2$ gas have a flow rate between 5 slm and 10 slm. In an embodiment of FIG. 8, the $H_2$ gas and the $O_2$ gas can have a same flow rate of 7 slm, for example. The mixture of the $H_2$ gas and the $O_2$ gas can subsequently form $H_2O$ steam (or water steam) in an annealing chamber for annealing the substrate. The generated water steam through the wet oxidation process can further induce compressive stress in the dielectric layer which can further be exerted on the substrate. Accordingly, the compressive stress can cause the substrate to bend downward with respect to the reference plane, and the bow value of the substrate tends to be negative. As shown in FIG.

8, the substrate on which the TEOS is formed can have similar bending degrees (or similar bow values) in conditions (a), (b), (d), and (e). However, the bow value tends to be more negative under the condition (c), which indicates that the wet oxidation process performed in condition (c) can induce a compressive stress on the substrate. The compressive stress can further cause the substrate to bend downward, and the bow value of the substrate accordingly tends to be more negative. Similarly, the substrate on which the HDP oxide is formed can have similar bending degrees (or bow values) in the conditions (b), (d), and (e), which can induce tensile stress on the substrate to cause the substrate bow upward. Accordingly, the bow values of the substrate in conditions (b), (d), and (e) tend to be positive. The wet oxidation in condition (c) can induce compressive stress on the substrate. Thus, the substrate can bow downward, and the bow value in condition (c) can tend to be more negative compared to the bow values in conditions (b), (d), and (e). For example, as shown in FIG. 8, compared to the bow values of the substrates at the conditions (b), (d), and (e) that are around −25 um, the bow value of the substrate on which the TEOS is formed is about −75 um at the condition (c). Compared to the bow values of the substrates at the conditions (b), (d), and (e) that are around 0 um, the bow value of the substrate on which the HDP oxide is formed is about −60 um.

Figure 9:
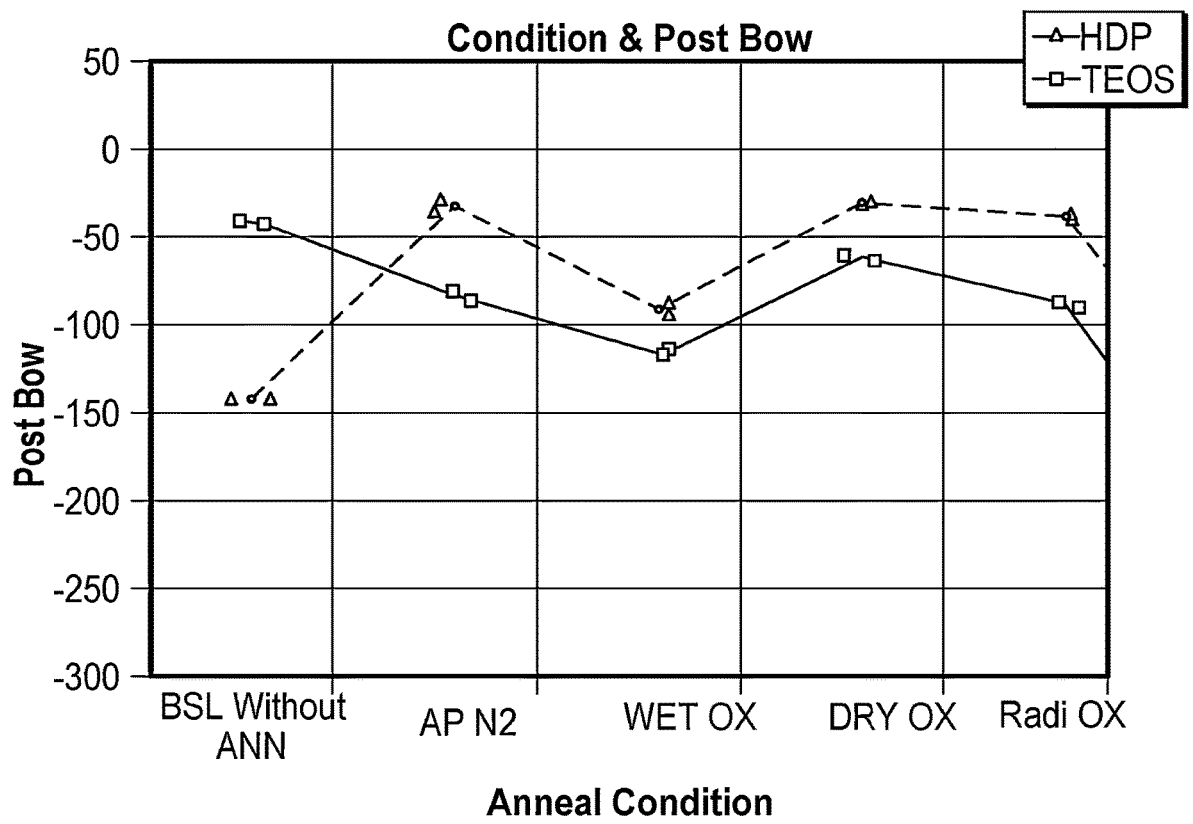
FIG. 9 is a third bow measurement chart showing impacts of different annealing process conditions on a substrate for controlling bow of the substrate, in accordance with exemplary embodiments of the disclosure.

FIG. 9 compares the web oxidation with other annealing conditions to impact the bending degree of the substrate. As shown in FIG. 9, five annealing process conditions are tested: (a) baseline without anneal (BSL Without ANN); (b) atmospheric $N_2$ anneal (AP $N_2$); (c) the wet oxidation process (WET OX); (d) atmospheric dry oxidation (DRY OX); and (e) radical oxidation (Radi OX). In an exemplary embodiment of FIG. 9, the condition (b) can be performed at 700° C., for 1 hour, with a $N_2$ flow rate of 20 slm. The condition (c) can be performed at 700° C., for 1 hour, with an $O_2$ gas flow rate of 7 slm and a $H_2$ gas flow rate of 7 slm, and under an atmospheric pressure. The condition (d) can be performed at 700° C., for 1 hour, with an $O_2$ gas flow rate of 5 slm and a $N_2$ gas flow rate of 5 slm. The condition (e) can be performed at a low pressure of 0.35 Torr, at 700° C., for 1 hour, with an $H_2$ gas flow rate of 1 slm and an $O_2$ gas flow rate of 5 slm. The condition (e) can generate a plasma that includes radicals, such as OH radicals and O radicals.

As shown in FIG. 9, the substrate can have similar bending degrees (or similar bow values) in the conditions (b), (d), and (e). Similar to the results in FIG. 8, the substrate tends to bow downward and the bow value tends to be more negative under the condition (c), which can indicate that the wet oxidation process under the condition (c) induces compressive stress on the substrate. The substrate accordingly bends downward and the bow value of the substrate tends to be more negative. For example, as shown in FIG. 9, compared to the bow values of the substrates at the conditions (b), (d), and (e) that are around −60 um to −80 um, the bow value of the substrate on which the TEOS is formed is about −120 um at the condition (c). Compared to the bow values of the substrates at the conditions (b), (d), and (e) that are about −30 um, the bow value of the substrate on which the HDP oxide is formed is about −100 um.

Figures 10A, 10B:
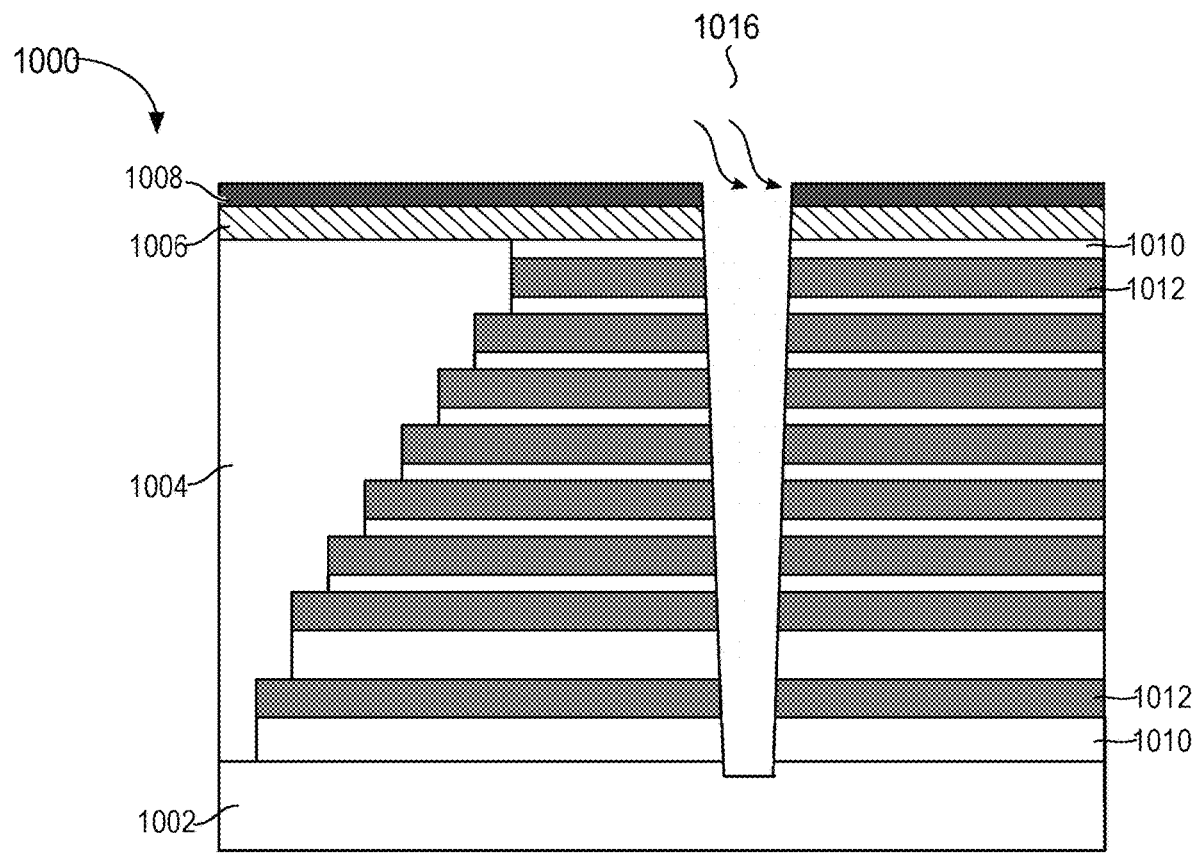
FIG. 10A is a cross-sectional view of a 3D-NAND memory structure on a substrate receiving an annealing process, in accordance with exemplary embodiments of the disclosure.
FIG. 10B is a bow measurement table showing impacts of different annealing process conditions on the 3D-NAND memory structure, in accordance with exemplary embodiments of the disclosure.

FIGS. 10A and 10B show the impact of the wet oxidation process on an intermediate structure 1000 (or structure 1000) of a 3D-NAND memory device that is in the manufacturing flow. As shown in FIG. 10A, the structure 1000 can have similar configurations to the structure 100 in FIG. 1. For example, the structure 1000 can include a stack of alternating oxide layers 1010 and sacrificial layers (e.g., nitride layers) 1012 formed over a substrate 1002. The stack can be positioned in a dielectric layer 1004. Further, one or more channel structure openings 1016 can be formed based on an etching process. The etching process can transfer patterns of a hard mask stack into the stack to form the one or more channel structure openings 1016. The hard mask stack can include an oxide layer 1006 and a SiN layer 1008, for example. Accordingly, the one or more channel structure openings 1016 can extend through the oxide layers 1010 and the nitride layers 1014, and further extend into the substrate 1002.

In order to remove etching residuals generated by the etching process, in related examples, a high temperature $N_2$ annealing process can be performed. The high temperature $N_2$ annealing process can be performed at a temperature more than 650° C., for example. Measurement data shows that the high temperature $N_2$ annealing process can densify structures of the oxide layers and nitride layers in the stack, which can increase the bow value of the substrate. Thus, the substrate can bow upward further after the high temperature $N_2$ annealing process. The increased bending degree of the substrate can impact subsequent manufacturing steps.

In the disclosure, the wet oxidation process can be applied to remove the etch residuals. Measurement data shows that the bow value of the substrate processed by the wet oxidation can be increased much less than the bow value of the substrate processed by the high temperature $N_2$ annealing process, which can benefit the subsequent manufacturing steps. FIG. 10B shows the measurement data of the bow values. As shown in FIG. 10B, the bow value of the substrate is increased by 25.49 um in an X-direction, and is decreased by 1.6 um in a Y-direction when the wet oxidation process is applied. While the bow value of the substrate is increased by 346 um in the X-direction, and increased by 265.25 um in the Y-direction when the high temperature $N_2$ annealing process is applied. The difference between the high temperature $N_2$ annealing process and the wet oxidation process can be that the high temperature $N_2$ annealing process can cause tensile stress on the substrate and the wet oxidation process can cause compressive stress on the substrate. Accordingly, the high temperature $N_2$ annealing process can cause the substrate to bend upward to increase the bow value, and the wet oxidation process can cause the substrate to bend downward to decrease the bow value.

It should be noted that additional manufacturing processes may be applied after the wet oxidation process to help remove the etch residuals. For example, a wet clean process may be applied subsequent to the wet oxidation process to help remove the etch residuals.

Figure 11:
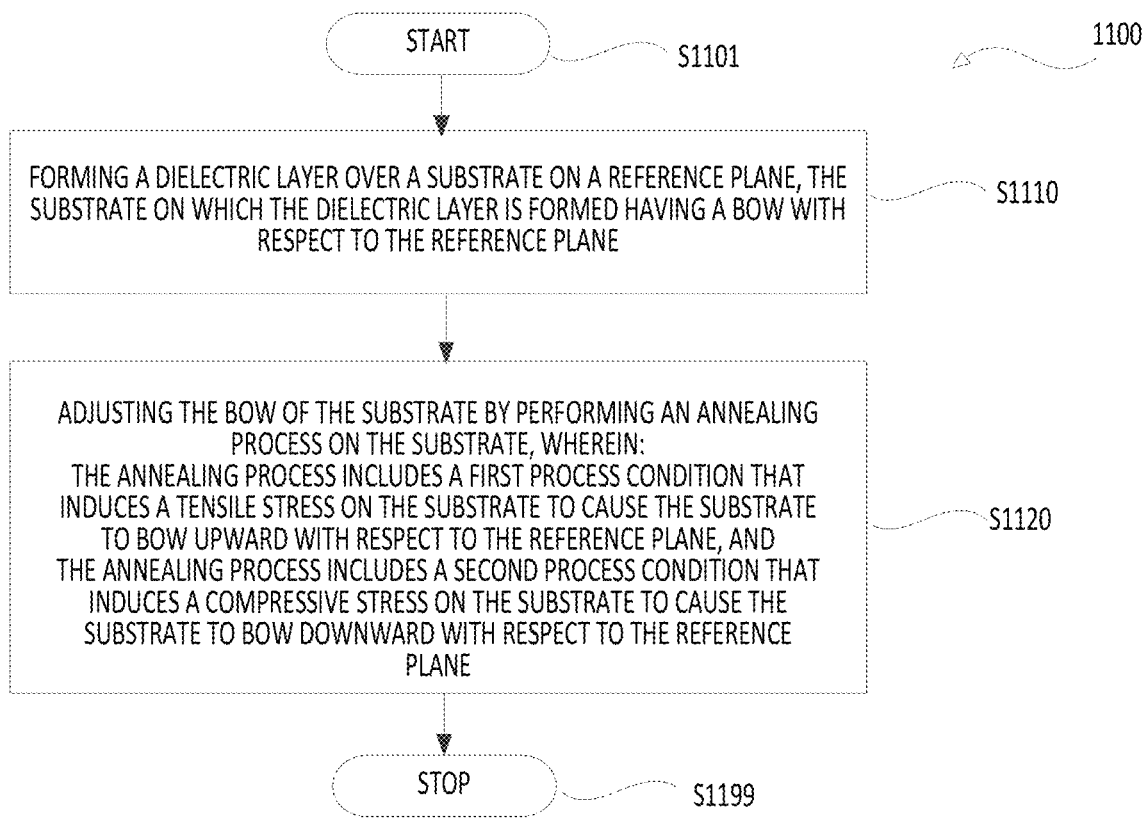
FIG. 11 is a flowchart of a first process for controlling bow of a substrate, in accordance with exemplary embodiments of the disclosure.

FIG. 11 is a flowchart of a process 1100 for controlling bow of a substrate. The process 1100 begins at step S1101, and then proceeds to S1110. At S1110, a dielectric layer can be formed over a substrate on a reference plane, where the substrate on which the dielectric layer is formed can have a bow with respect to the reference plane.

The process 1100 then proceeds to S1120. At S1120, the bow of the substrate can be adjusted by performing an annealing process on the substrate. In an embodiment, the annealing process can induce a tensile stress on the substrate to cause the substrate to bow upward with respect to the reference plane according to a first process condition. In another embodiment, the annealing process can induce a compressive stress on the substrate to cause the substrate to bow downward with respect to the reference plane according to a second process condition.

In order to form the dielectric layer over the substrate, one of HDP silicon oxide and TEOS can be deposited over the substrate. Thus, the substrate can bow downward with respect to the reference plane and a value of the bow can be negative after the one of the HDP silicon oxide and the TEOS is deposited on the substrate.

In some embodiments, the first process condition of the annealing process can include a $N_2$ gas with a flow rate between 15 slm and 25 slm, a processing time in a range between 3 hours and 5 hours, a processing temperature in a range between 500° C. and 700° C., and a pressure in a range from 0.1 Torr to 760 Torr. Accordingly, as shown in FIG. 7, the value of the bow of the substrate can increase by 10 um to 70 um in response to the TEOS being deposited and the first process condition of the annealing process being applied. The value of the bow of the substrate can increase by 110 um and 150 um in response to the HDP silicon oxide being deposited and the first process condition of the annealing process being applied.

In some embodiments, as shown in FIG. 6, the first process condition of the annealing process can reduce a hydrogen atomic concentration in the dielectric layer.

In the process 1120, the second process condition of the annealing process can include a $N_2$ gas with a flow rate between 15 slm and 25 slm, a processing time in a range between 3 hours and 5 hours, a processing temperature larger than 700° C., and a pressure in a range from 0.1 Torr to 760 Torr. Accordingly, as shown in FIG. 7, the value of the bow of the substrate can increase by 50 um to 100 um in response to the HDP silicon oxide being deposited and the second process condition of the annealing process being applied, and the value of the bow of the substrate can decrease by 80 um to 120 um in response to the TEOS being deposited and the second process condition of the annealing process being applied.

In some embodiments, the second process condition of the annealing process can include $H_2O$ steam generated by a mixture of a $H_2$ gas and an $O_2$ gas with a ratio of 1:1 to 3:1, the $H_2$ gas having a flow rate between 5 slm and 10 slm, the $O_2$ gas having a flow rate between 5 slm and 10 slm, a processing time in a range between 1 hours and 3 hours, and a processing temperature between 600° C. and 700° C. Accordingly, as shown in FIG. 8, the value of the bow of the substrate can decrease by 30 um to 70 um in response to the TEOS being deposited and the second process condition of the annealing process being applied. The value of the bow of the substrate can increase by 55 um to 95 um in response to the HDP silicon oxide being deposited and the second process condition of the annealing process being applied.

Figure 12:
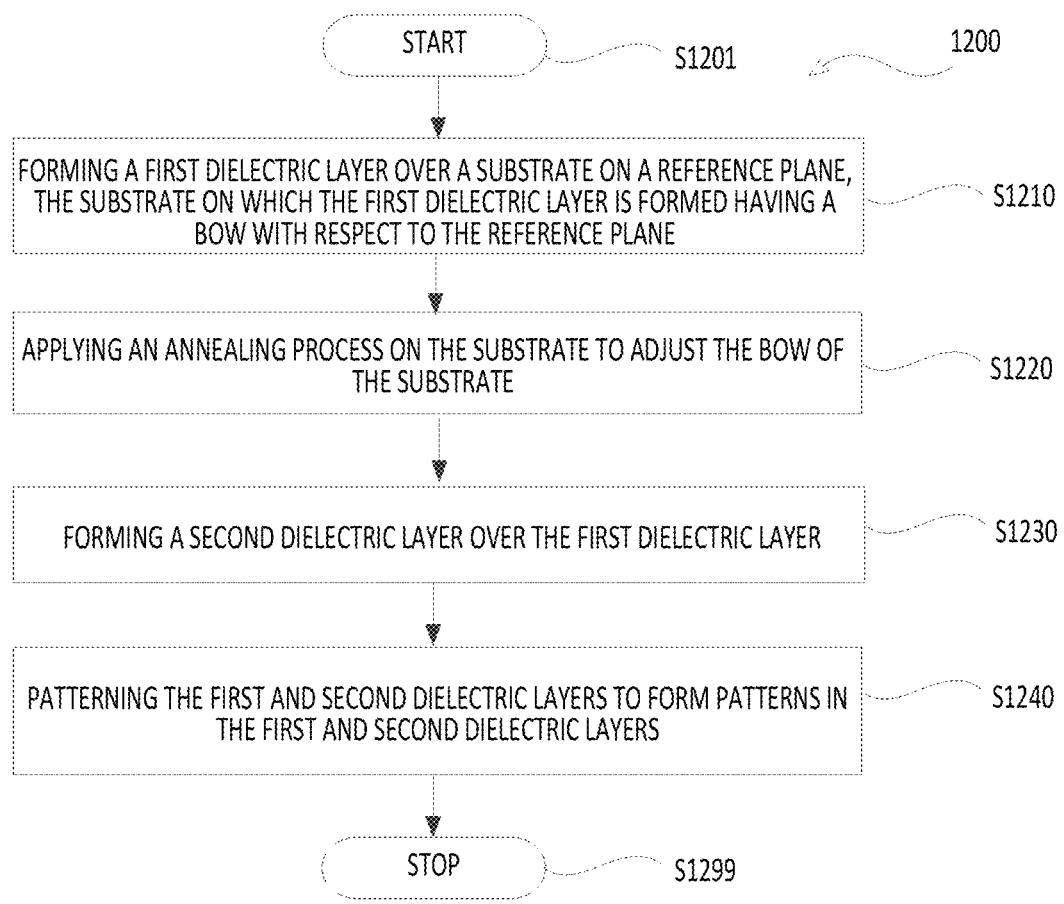
FIG. 12 is a flowchart of a second process for controlling bow of a substrate, in accordance with exemplary embodiments of the disclosure.

FIG. 12 is a flowchart of a process 1200 for controlling bow of a substrate. The process 1200 begins at step S1201, and then proceeds to S1210. At S1210, a first dielectric layer can be formed over a substrate on a reference plane so that the substrate on which the first dielectric layer is formed can have a bow with respect to the reference plane.

The process 1200 can proceed to 51220, where an annealing process can be performed on the substrate to adjust the bow of the substrate.

At S1230, a second dielectric layer can be formed over the first dielectric layer.

At S1240, the first and second dielectric layers can be patterned to form patterns in the first and second dielectric layers. The annealing process in the process 1200 can induce a tensile stress on the substrate to cause the substrate to bow upward with respect to the reference plane according to a first process condition. The annealing process can also induce a compressive stress on the substrate to cause the substrate to bow downward with respect to the reference plane according to a second process condition.

In some embodiments, the process 1200 can be performed as illustrated with reference to FIG. 4.

In some embodiments, the first dielectric layer can include HDP silicon oxide and the second dielectric layer can include TEOS.

In some embodiments, the first process condition of the annealing process can include a $N_2$ gas with a flow rate between 15 slm and 25 slm, a processing time in a range between 3 hours and 5 hours, a processing temperature in a range between 500° C. and 700° C., and a pressure in a range from 0.1 Torr to 760 Torr. Accordingly, as shown in FIG. 7, a value of the bow of the substrate can increase by 10 um to 70 um in response to the TEOS being deposited on the substrate and the first process condition of the annealing process being applied. The value of the bow of the substrate can increase by 110 um and 150 um in response to the HDP silicon oxide being deposited on the substrate and the first process condition of the annealing process being applied.

In some embodiments, as shown in FIG. 6, the first process condition of the annealing process can reduce a hydrogen atomic concentration in the first and second dielectric layers.

In the process 1200, the second process condition of the annealing process can include a $N_2$ gas with a flow rate between 15 slm and 25 slm, a processing time in a range between 3 hours and 5 hours, a processing temperature larger than 700° C., and a pressure in a range from 0.1 Torr to 760 Torr. Accordingly, as shown in FIG. 7, a value of the bow of the substrate can increase by 50 um to 100 um in response to the HDP silicon oxide being deposited on the substrate and the second process condition of the annealing process being applied. The value of the bow of the substrate can decrease by 80 um to 120 um in response to the TEOS being deposited on the substrate and the second process condition of the annealing process being applied.

Figure 13:
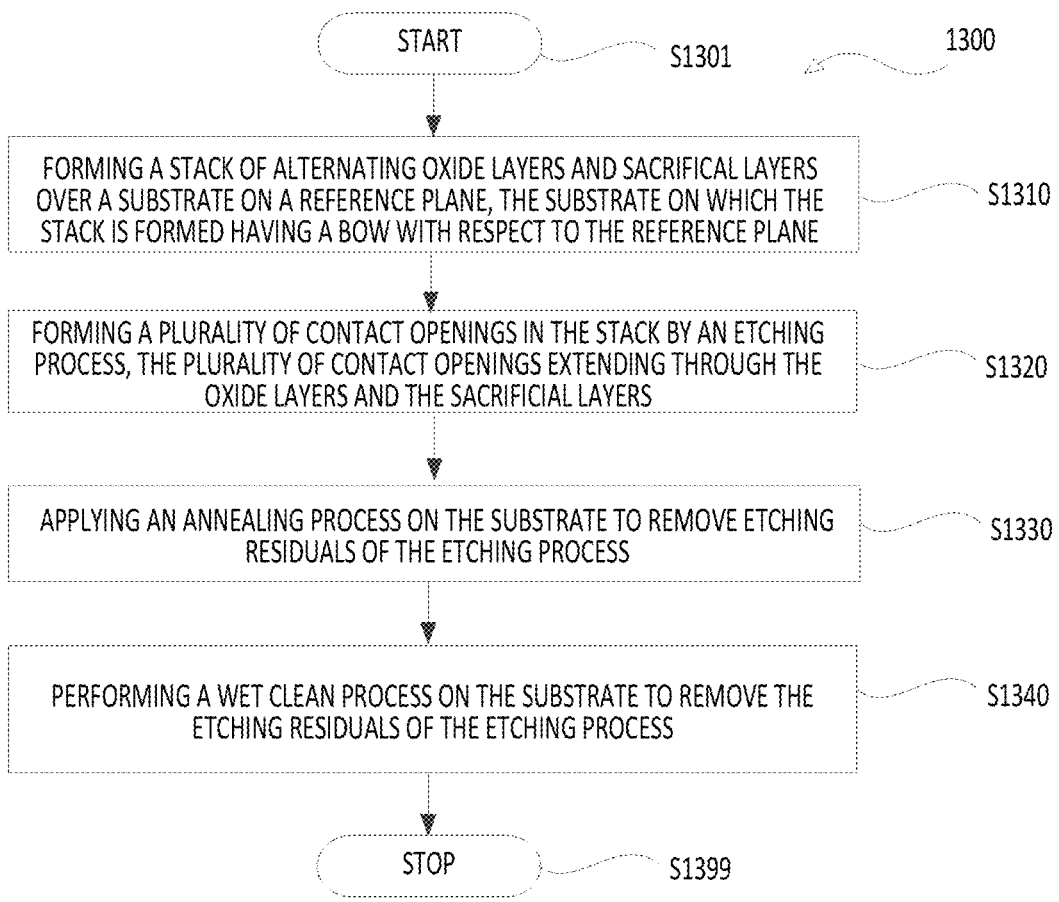
FIG. 13 is a flowchart of a third process for controlling bow of a substrate, in accordance with exemplary embodiments of the disclosure.

FIG. 13 is a flowchart of a process 1300 for controlling bow of a substrate. The process 1300 begins at step S1301, and then proceeds to S1310. At S1310, a stack of alternating oxide layers and sacrificial layers can be formed over a substrate on a reference plane, where the substrate on which the stack is formed can have a bow with respect to the reference plane.

At S1320, a plurality of contact openings can be formed in the stack by an etching process, where the plurality of contact openings can extend through the oxide layers and the sacrificial layers.

At S1330, an annealing process can be performed on the substrate to remove etching residuals of the etching process.

At S1340, a wet clean process can be performed on the substrate to remove the etching residuals of the etching process. The annealing process in the process 1300 can induce a tensile stress on the substrate to cause the substrate to bow upward with respect to the reference plane according to a first process condition, and induce a compressive stress on the substrate to cause the substrate to bow downward with respect to the reference plane according to a second process condition.

In some embodiments, the process 1300 can be performed as illustrated with reference to FIGS. 10A and 10B.

In some embodiments, the second process condition of the annealing process can include $H_2O$ steam generated by a mixture of a $H_2$ gas and an $O_2$ gas with a ratio of 1:1 to 3: the $H_2$ gas having a flow rate between 5 slm and 10 slm, the $O_2$ gas having a flow rate between 5 slm and 10 slm, a processing time in a range between 1 hours and 3 hours, and a processing temperature between 600° C. and 700° C. Accordingly, as shown in FIG. 10B, a value of the bow of the substrate can be in a range between 150 um to 200 um in a first direction, and in a range between 80 um to 120 um in a second direction before the annealing process is applied on the substrate. The value of the bow of the substrate can increase by 10 um to 50 um in the first direction, and decrease by 1 um to 10 um in the second direction after the annealing process is applied on the substrate.

In some embodiments, the first process condition of the annealing process can include a $N_2$ gas with a flow rate between 15 slm and 25 slm, a processing time in a range between 3 hours and 5 hours, and a processing temperature in a range between 500° C. and 700° C., an a pressure in a range from 0.1 Torr to 760 Torr.

The various embodiments described herein offer several advantages over methods in related examples to control the bending degree of a substrate. In related examples, a dielectric layer can be formed on a backside of the substrate to compensate for the stress induced by the dielectric layers formed on a front side of the substrate. The dielectric layer formed on the backside of the substrate can then be removed. The way to control the bending degree of the substrate in the related examples is costly. In the disclosure, various annealing processes (or heat treatment processes) different from the related heat treatment process can be applied according to the manufacturing positions of the 3D-NAND memory device. Thus, the substrate on which the 3D-NAND memory device is formed can maintain a same bending degree, a more negative bending degree, or a more positive bending degree to meet the process requirements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of controlling bow of a substrate, comprising:
   providing a substrates;
   depositing a dielectric layer which includes one of high density plasma (HDP) silicon oxide material and tetraethyl orthosilicate (TEOS) material over the substrate, the substrate having a downward bow with respect to a reference plane and a value of the bow being negative after the one of the HDP silicon oxide material and the TEOS material is deposited on the substrate; and
   adjusting the bow of the substrate by performing an annealing process on the substrate, wherein:
      the annealing process includes one of a first process condition and a second process condition, the first process condition inducing a tensile stress on the substrate to cause the substrate to bow upward with respect to the reference plane, and the second process condition inducing a compressive stress on the substrate to cause the substrate to bow downward with respect to the reference plane.

2. The method of claim 1, wherein the first process condition of the annealing process comprises:
   a processing temperature in a range between 550° C. and 650° C., and
   a protective annealing gas that includes at least one of a $N_2$ gas, a $H_2$ gas, a He gas, a $O_2$ gas, or a Ar gas.

3. The method of claim 1, wherein the first process condition of the annealing process comprises:
   a $N_2$ gas with a flow rate between 15 standard liter per minute (slm) and 25 slm,
   a processing time in a range between 3 hours and 5 hours,
   a processing temperature in a range between 500° C. and 700° C., and
   a pressure in a range from 0.1 Torr to 760 Torr.

4. The method of claim 2, wherein the first process condition of the annealing process reduces a hydrogen atomic concentration in the dielectric layer.

5. The method of claim 1, wherein the second process condition of the annealing process comprises:
   a processing temperature equal to or larger than 700° C., and
   a protective annealing gas that includes at least one of a $N_2$ gas, a $H_2$ gas, a He gas, a $O_2$ gas, or a Ar gas.

6. The method of claim 1, wherein the second process condition of the annealing process comprises:
   a $N_2$ gas with a flow rate between 15 standard liter per minute (slm) and 25 slm,
   a processing time in a range between 3 hours and 5 hours,
   a processing temperature larger than 700° C., and
   a pressure in a range from 0.1 Torr to 760 Torr.

7. The method of claim 1, wherein the second process condition of the annealing process comprises:
   $H_2O$ steam annealing atmosphere.

8. The method of claim 7, wherein the second process condition of the annealing process comprises:
   $H_2O$ steam generated by a mixture of a $H_2$ gas and an $O_2$ gas with a ratio of 1:1 to 3:1, the $H_2$ gas having a flow rate between 5 standard liter per minute (slm) and 10 slm, the $O_2$ gas having a flow rate between 5 slm and 10 slm,
   a processing time in a range between 1 hours and 3 hours, and
   a processing temperature between 600° C. and 700° C.

9. The method of claim 1, wherein the providing the substrate further comprises:
   forming a stack of alternating insulating layers and word line layers over the substrate, the stack including an array region and a staircase region; and
   depositing the one of the HDP silicon oxide material and the TEOS material over the stack of alternating insulating layers and word line layers.

* * * * *